United States Patent [19]

Ozawa et al.

[11] Patent Number: 4,967,312
[45] Date of Patent: Oct. 30, 1990

[54] CASE FOR CIRCUIT BOARD WITH LIGHT-RECEIVING ELEMENT

[75] Inventors: Kaoru Ozawa; Hiroshi Okawara, both of Nara, Japan

[73] Assignee: Sharp Kabushiki Kaisha, Osaka, Japan

[21] Appl. No.: 401,547

[22] Filed: Aug. 31, 1989

Related U.S. Application Data

[63] Continuation of Ser. No. 185,154, Apr. 22, 1988, abandoned.

[30] Foreign Application Priority Data

Apr. 24, 1987 [JP] Japan .............................. 62-62920[U]

[51] Int. Cl.$^5$ .............................................. H05K 5/00
[52] U.S. Cl. .................................... 361/399; 361/394; 361/395
[58] Field of Search ............................. 174/35 R, 52 R; 361/392, 394, 398, 399, 424; 455/603

[56] References Cited

U.S. PATENT DOCUMENTS

| | | | |
|---|---|---|---|
| 3,541,230 | 11/1970 | Kramer | 174/52.1 X |
| 3,684,817 | 8/1972 | Card et al. | 174/52.1 |
| 3,950,603 | 4/1976 | Brefka II | 174/52.1 |
| 4,092,698 | 5/1978 | Brfka | 361/399 |
| 4,262,365 | 4/1981 | George | 455/603 |
| 4,310,870 | 1/1982 | Kia et al. | 361/399 X |
| 4,325,103 | 4/1982 | Ito et al. | 361/424 |
| 4,388,671 | 6/1983 | Hall et al. | 361/399 X |
| 4,528,616 | 7/1985 | Koppensteiner | 174/52.1 X |
| 4,688,149 | 8/1987 | Inoue et al. | 361/399 |
| 4,709,412 | 11/1987 | Seymour et al. | 455/603 |
| 4,750,091 | 6/1988 | Hout | 361/399 XR |

FOREIGN PATENT DOCUMENTS

| | | | |
|---|---|---|---|
| 0207226 | 1/1987 | European Pat. Off. | 361/424 |
| 1242726 | 6/1967 | Fed. Rep. of Germany | 361/399 |
| 3504874 | 8/1986 | Fed. Rep. of Germany | 361/399 |
| 2368096 | 12/1978 | France | 455/603 |

OTHER PUBLICATIONS

Steve Ciarcia, USe Infrared Communication for Remote Control, BYTE, Apr., 1982, vol. 7, #4, pp. 40 to 49.
Ron De Jong, 2 Channel Infrared Remote Control, Electronics, (Australia), vol. 43, #5, May., 1981, pp. 50 to 57.

Primary Examiner—Gregory D. Thompson
Attorney, Agent, or Firm—Flehr, Hohbach, Test, Albritton & Herbert

[57] ABSTRACT

A case for enclosing a circuit board has a housing with walls and a circuit board with a light-receiving element attached perpendicularly thereonto is inserted into the housing to be secured at a specified position. To correctly position the circuit board and to secure it at this position, parts of the walls are bent inward protrudingly such that when the circuit board is inserted, these inwardly protruding parts are elastically compressed outward. As soon as the circuit board reaches the specified position, these elastically compressed pieces spring back to their normal inwardly bent positions to prevent the circuit board from disengaging.

3 Claims, 2 Drawing Sheets

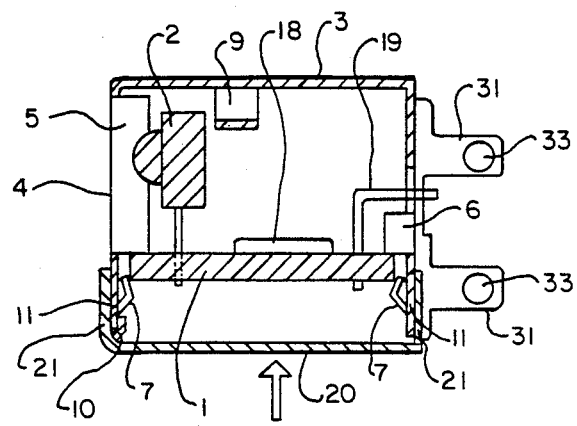
FIG.—1
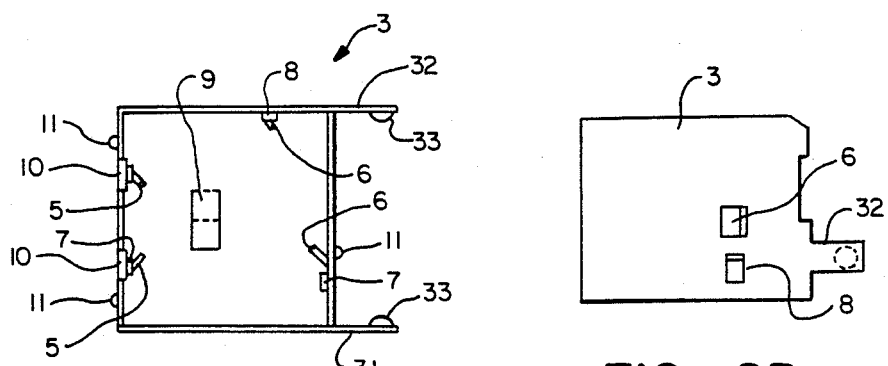
FIG.—2A  FIG.—2B
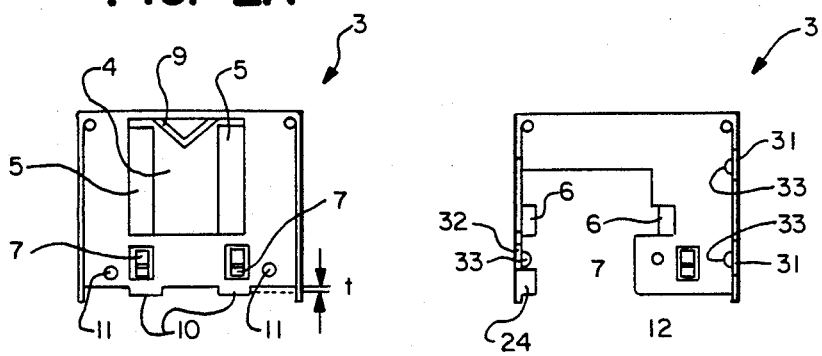
FIG.—2C  FIG.—2D

CASE FOR CIRCUIT BOARD WITH LIGHT-RECEIVING ELEMENT

This is a continuation, of application Ser. No. 185,154 filed 04/22/88 now abandoned.

BACKGROUND OF THE INVENTION

This invention relates to a case for containing a circuit board with a light-receiving element disposed thereon and more particularly to a case which electromagnetically shields a light-receiving unit for a remote control apparatus.

An infrared ired light-receiving unit for a remote control video tape recorder or television set is generally disposed inside a case having a light-receiving window and operates when a light beam incident through this window is received by a light-receiving element on a circuit board. A conventional mechanism for securing a circuit board to such a case is shown in FIG. 5 wherein numeral 51 indicates a case housing with a plurality of positioning pieces 52 provided on its inner side walls. A circuit board 53 is inserted into the housing 51 as shown by the arrow and set against these positioning pieces 52. A base board 54 provided with a plurality of raised pieces 55 for supporting the circuit board 53 is set to the housing 51 to cover the bottom, surface of the circuit board 53. As shown in FIG. 6, the housing 51 has downwardly protruding parts 61a and the circuit board 53, as well as the base board 54, becomes fastened to the housing 51 with these protruding parts bent inwardly as shown in FIG. 7.

With a conventional case thus structured, however, it is difficult to position the circuit board 53 accurately and efficiently because positioning and securing of the circuit board are effected by means of both the case housing 51 and the base board 54. Unless both the case housing 51 and the base board 54 are firmly secured, the circuit board 53 may become disoriented and this can adversely affect the operation of a light-receiving element (not shown in FIGS. 5 and 6) attached to the circuit board 53. A light-receiving element shown at 56 in FIG. 7 is usually attached parallel to the circuit board 53 by bending its lead lines and a light-receiving window 57 is formed in the upper surface of the case housing 51. Since electronic components 58 such as LSI circuits and an output terminal 59 are mounted on the circuit board 53, it is generally required to provide a screening member (not shown) between the light-receiving element 56 and such electronic components 58 in order to electromagnetically shield these components against noise received through the light-receiving window 57.

SUMMARY OF THE INVENTION

It is therefore an object of the present invention to eliminate such problems associated with a conventional case by providing an improved case for a circuit board such that the circuit board as well as a light-receiving element thereon can be dependably positioned, that the positional relationship between the light-receiving window in the case housing and the light-receiving element can be made uniform and that its electromagnetic shielding is sufficiently effective.

In other words, the present invention relates to a case for containing a circuit board having a light-receiving element disposed thereon perpendicularly thereto such that not only the positioning of the light-receiving element with respect to the light-receiving widow but also the positioning and securing of the circuit board and the light-receiving element thereon can be easily effected.

A case embodying the present invention, with which the above and other objects can be achieved, is characterized not only as having a circuit board with electronic circuits and a light-receiving element disposed perpendicularly thereon and a case housing with an opening through which the aforementioned circuit board and light-receiving element can be inserted thereinto but also wherein the case housing is provided with a light-receiving window opposite to the light-receiving surface of the light-receiving element on the circuit board and securing members for supporting and securing the circuit board and the light-receiving element such that the circuit board can be secured by these securing members which are parts of the case housing itself and no separate bottom plate or the like is required.

With a case thus structured, since the circuit board is supported and secured by the case housing itself, relative positioning and securing of the circuit board to the case housing can be effected easily and dependably as soon as the circuit board is inserted into the case housing. The light-receiving element on the circuit board is contained while maintaining its perpendicular position with respect to the circuit board and, since it is sufficiently separated from the electronic components such as LSI circuits, they can be electromagnetically shielded. Moreover, the securing members also serve to accurately position and firmly secure the light-receiving element, thereby dependably determining the mutual positional relationship between the light-receiving element and the light-receiving window on the case housing. As a result, the case of the present invention can be assembled easily and quickly, thereby significantly improving the work efficiency.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a schematic side sectional view for showing the inner structure of a case embodying the present invention, FIGS. 2A–2D are drawings for showing the structure of the housing of the case shown in FIG. 1, FIG. 2A being its bottom view taken along the direction of the arrow in FIG. 1, FIG. 2B being its side view, FIG. 2C being its front view and FIG. 2D being its back view.

DETAILED DESCRIPTION OF THE INVENTION

Figure 3A:
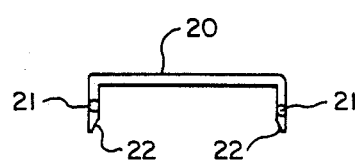
FIGS. 3A and 3B are drawings for showing the structure of a bottom cap for the case shown in FIG. 1, FIG. 3A being its sectional view and FIG. 3B being its plan view.

In what follows, the present invention is described as applied to and embodied in a shielding case for an infrared light-receiving unit of a remote control video tape recorder or television set. As shown in FIG. 1, this shielding case is composed of a circuit board 1, a light-receiving element 2 disposed perpendicularly to the circuit board 1, and a case housing 3 which contains therein the circuit board 1 and the light-receiving element 2. The circuit board 1 is additionally provided with electronic and electric circuit elements (schematically shown at 18) such as LSI circuits other than the light-receiving element 2 and an output terminal 19. The case housing 3 is provided with a light-receiving window 4 on its front wall opposite to the light-receiving surface of the light-receiving element 2. With reference now additionally to FIGS. 2A and 2C, numerals 5 indicate rectangular parts of the front wall material on both sides of the light-receiving window 4 which are bent towards the interior of the housing 3. With reference similarly to FIGS. 2B and 2D in addition to FIG. 1, numeral 6 indicates a part of the back wall of the housing 3 which is cut therefrom and bent also towards the interior of the housing 3. These inwardly bent parts 5 and 6 serve, as shown in FIGS. 1, for positioning the circuit board 1 by pressing thereagainst.

Below the inwardly bent parts 5 and 6 and separated therefrom by the thickness of the circuit board 1, there are board supporting pieces 7 and inwardly protruding holder piece 8 similarly formed on the walls of the housing 3. These board supporting pieces 7 are formed by cutting the walls of the housing 3 and bent as best shown in FIG. 1 to acquire elastic characteristics. The inwardly protruding holder piece 8 is inwardly bent from one of the side walls so as to prevent the circuit board 1, once placed in position, from becoming disengaged. Numeral 9 indicates a part of the upper wall (roof) which is driven in as shown in FIG. 2C to protrude towards the interior of the housing at the back of the light-receiving element 2 as shown in FIG. 1 so as to prevent the light-receiving element 2 from falling down backward if an external force is applied thereonto through the window 4. The front wall of the housing 3 (wherein the window 4 is formed) is provided with two folding pieces 10 protruding downward as best seen in FIG. 2C. Numeral 11 indicates outward protrusions provided on the front and back walls of the housing 3 for securing a cap 20 for the housing 3.

The circuit board 1 is inserted into the housing 3 from below as shown by the arrow in FIG. 1 with the cap 20 removed, pressing and sliding against the board supporting pieces 7 and the holder piece 8 which all protrude inwardly from the inner surface of the housing 3, and provide elastic forces on the circuit board 1 as it is inserted. The supporting pieces 7 are naturally bent as shown in FIG. 1 and the circuit board 1, while sliding in thereagainst, tends to flatten them. As the circuit board 1 further advances in the direction of the arrow, it comes into contact with the bottom edges of the inwardly bent parts 5 and 6 on the front and back walls of the housing, thereby becoming accurately positioned inside the housing 3. The bottom edges of these inwardly bent parts 5 and 6 and the top edges of the pieces 7 and 8 are separated vertically by the thickness of the circuit board 1 such that as soon as the circuit board 1 comes into contact with the bottom edges of the inwardly bent parts 5 and 6, the supporting pieces 7 and holder piece 8 spring back by their own elastic forces to assume natural inwardly protruding positions, thereby securing the circuit board 1 in its normal position in contact with the inwardly bent parts 5 and 6 as shown in FIG. 1.

At the same time, the light-receiving element 2 on the circuit board while remaining disposed perpendicularly to the circuit board 1, becomes securely positioned opposite to the light-receiving window 4 of the housing 3. Because of the piece 9 driven in from the ceiling of the housing 3, the light-receiving element 2, even if it is pushed from the front side, touches this driven piece 9 protruding downward into the interior of the housing 3 and does not fall back any further. The gap between the back surface of the light-receiving element 2 and the downwardly protruding piece 9 is appropriately set in view of factors related to the operations of the unit.

Figure 3B:
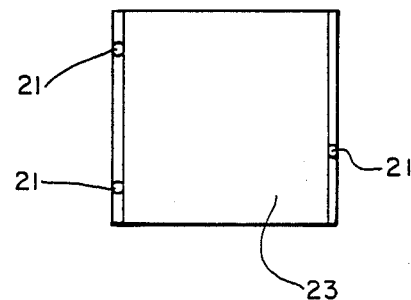

The bottom cap 20 is structured as shown in FIGS. 3A and 3B with two mutually opposite side walls 21 raised perpendicularly with respect to its base 23, and is adapted to be attached to the housing 3 also from below in the direction of the arrow shown in FIG. 1. The side walls 21 are provided with holes (not shown) for accepting the aforementioned outward protrusions 11 formed on the front and back walls of the housing 3 such that the bottom cap 20 can be securely attached to the housing 3. With reference to FIG. 2D, numeral 24 indicates a small piece extending from a side wall of the housing 3 and bent therefrom for the convenience of the positioning of this bottom cap 20. With reference to FIGS. 1 and 2A-2D, numerals 31 and 32 indicate pieces extending protrudingly backward from the side walls of the housing 3. Each of these extending pieces 31 and 32 is provided with a protrusion 33 to be made use of in securing the housing 3 in a unit of which it is a part.

For the purpose of securing a circuit board within a case when miniaturization is important, it is common to make the inner dimensions of the case substantially match the outer dimensions of the circuit board. If this is done, however, installation of the circuit board into the housing becomes very difficult because the circuit board, when it is inserted into the housing, tends to hit the side edges of the bottom opening. This naturally makes their mass production very impractical. The aforementioned folding pieces 10 protruding downward from the front wall of the housing 3 as shown in FIG. 2C are provided in view of this problem. These folding pieces 10 are folded inwardly as shown in FIG. 1 so as to provide smoothly curved external surfaces which make the insertion of the circuit board 1 easier. These folding pieces 10 are provided only at mutually separate places along the bottom edge portions of the front wall, however, because the effects of protruding pieces 7 and 8 which elastically compresses the circuit board 1 would be adversely affected and the attachment of the bottom cap 20 would become difficult if such folding pieces 10 were provided continuously all along the bottom edge. The distance (indicated by t in FIG. 2C) by which these folding pieces 10 protrude from the bottom edge of the front wall is so determined that, when the bottom cap 20 is attached to the housing 3, the bottom edges of the side walls of the case will be flush with the surface of the attached cap 20.

Although the bottom cap 20 is designed such that its inner dimensions substantially match the outer dimensions of the case, the aforementioned curved surfaces formed by the folding pieces 10 as shown in FIG. 1 make it easier to fit them together.

Figure 4:
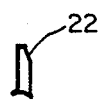
FIG. 4 is an enlarged sectional view of a portion of FIG. 3A, and FIGS. 5, 6 and 7 are drawings for showing the positioning and securing of a circuit board in a prior art housing, FIGS. 5 and 7 being sectional views and FIG. 6 being a side view.
Figure 5:
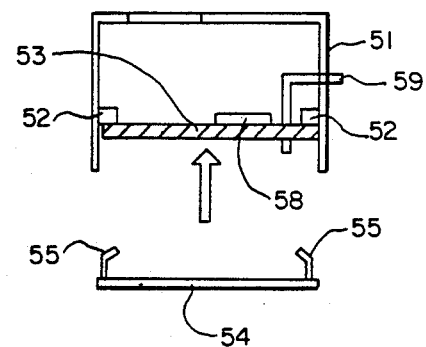
Figure 6:
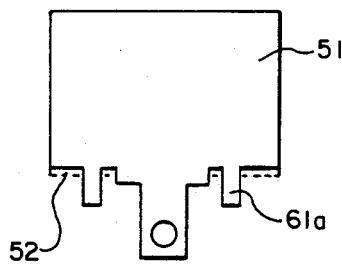
Figure 7:
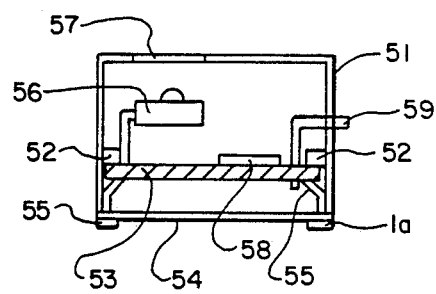

With reference again to FIG. 3A, the inner surfaces of the side walls 21 of the bottom cap 20 are processed so as to be sloped along their edges such that the cap 20 can be easily attached to the housing 3. Numerals 22 indicate these sloped surfaces and FIG. 4 shows this slope more clearly. The bottom edge of the back surface of the housing 3 (shown at 12 in FIG. 2D) is also formed with a slope for the same purpose but the slope is on the side of the outer surface.

In summary, the present invention discloses a new design for a case for enclosing a circuit board such that not only the circuit board itself but also a light-receiving element disposed thereon can be accurately positioned and dependably secured as soon as it is inserted into its housing because parts of the walls of the housing itself which are driven or cut and bent inward protrudingly towards the interior of the housing are used for its positioning and securing. The circuit board is pushed into the housing by elastically compressing some of these inwardly protruding pieces and slidingly thereagainst. Folding pieces protruding from the bottom edge of the front wall are folded over to provide smooth curved surfaces which make both the insertion of the circuit board and the attachment of the bottom cap easier. No additional screen is needed to electromagnetically shield the electronic components on the circuit board. The case embodying the present invention, as a whole, is of a simple structure and can be assembled easily.

What is claimed is:

1. In a circuit board case comprising a horizontal circuit board with electrical and/or electronic circuits attached thereon, a light-receiving element having a light-receiving surface thereon and being disposed on said circuit board, and a housing having walls which define an interior thereof and containing said circuit board and said light-receiving element in said interior, some of said walls defining a bottom opening through which said circuit board and said light-receiving element thereon can be inserted into said interior, the improvement wherein said light-receiving element is attached to said circuit board, stands thereon and extends perpendicularly so as to be sufficiently separated from electrical and/or electronic circuits on said circuit board, said light-receiving surface is substantially perpendicular to said circuit board so as to receive light which is incident thereon substantially parallel to said circuit board, said housing is provided with a window on one of said walls perpendicular to said circuit board, said one of said walls being opposite to said light-receiving surface, a fall-preventing part, supporting parts and holding parts are formed unistructurally with said housing, protruding inward into said interior, said supporting parts being naturally bent to be elastic so as to be compressed elastically outward as said circuit board is slidingly passed through said opening to a set position, said fall-preventing part and said holding parts being so disposed that, after said circuit board reaches said set position, said holding parts serve to secure said circuit board at said set position and said fall-preventing part serves to prevent said light-receiving element from falling down when an external force is applied thereon through said window, said supporting and holding parts are separated from each other by the thickness of said circuit board so as to secure said circuit board therebetween at said set position, and another of said walls has bottom edge portions at said openings rolled such that said circuit board can be passed through said opening easily.

2. The case of claim 1 wherein said housing also has a ceiling and said fall-preventing part is a portion of said ceiling protruding downward into said interior.

3. The case of claim 1 further comprising a cap for covering said opening, said cap having a base plate and side walls on opposite sides of said base plate, said side walls being adapted to slidingly engage with some of said walls perpendicular to said circuit board.

* * * * *